(12) United States Patent
Ishii

(10) Patent No.: US 11,557,540 B2
(45) Date of Patent: Jan. 17, 2023

(54) SEMICONDUCTOR DEVICE

(71) Applicant: Kioxia Corporation, Tokyo (JP)

(72) Inventor: Hitoshi Ishii, Chigasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/004,244

(22) Filed: Aug. 27, 2020

(65) Prior Publication Data

US 2021/0287992 A1 Sep. 16, 2021

(30) Foreign Application Priority Data

Mar. 16, 2020 (JP) .............................. JP2020-045222

(51) Int. Cl.
| | | |
|---|---|---|
| *H01L 23/538* | (2006.01) | |
| *H01L 23/00* | (2006.01) | |
| *H01L 25/065* | (2006.01) | |

(52) U.S. Cl.
CPC ...... *H01L 23/5384* (2013.01); *H01L 23/5385* (2013.01); *H01L 23/5386* (2013.01); *H01L 24/14* (2013.01); *H01L 25/0657* (2013.01)

(58) Field of Classification Search
CPC ............. H01L 23/5384; H01L 23/5385; H01L 23/5386; H01L 23/49816; H01L 23/49838; H01L 23/49827; H01L 24/14; H01L 25/0657; H01L 2225/06506
See application file for complete search history.

(56) References Cited

U.S. PATENT DOCUMENTS

| | | | |
|---|---|---|---|
| 8,692,135 B2 | 4/2014 | Funaya et al. | |
| 10,784,244 B2* | 9/2020 | Han | ........................ H01L 24/83 |
| 10,923,430 B2* | 2/2021 | Lin | ...................... H01L 23/3157 |
| 11,018,080 B2* | 5/2021 | Weerasekera | ........... H01L 25/50 |
| 2001/0039300 A1 | 11/2001 | Suzuki et al. | |
| 2001/0045649 A1 | 11/2001 | Sumikawa et al. | |
| 2012/0001324 A1 | 1/2012 | Aoki et al. | |

(Continued)

FOREIGN PATENT DOCUMENTS

| | | |
|---|---|---|
| JP | 2000-091466 A | 3/2000 |
| JP | 2000-156551 A | 6/2000 |

(Continued)

*Primary Examiner* — Dao H Nguyen
(74) *Attorney, Agent, or Firm* — Foley & Lardner LLP

(57) ABSTRACT

A semiconductor device having a substrate, a semiconductor chip, and a plurality of electrode terminals is provided. The substrate has first and second principal surfaces. The semiconductor chip is disposed on the first principal surface. The electrode terminals are disposed on the second principal surface. The substrate has a via interconnection near a position at which an outer edge line of the semiconductor chip intersects an outer outline of the electrode terminal farthest from a center of the substrate, the electrode terminal farthest from the center of the substrate being among the plurality of electrode terminals overlapping the outer edge line in a predetermined condition as seen through the substrate of the semiconductor device from a direction perpendicular to the first principal surface, the via interconnection connecting a first interconnection layer on a first principal surface-side to a second interconnection layer on a second principal surface-side.

16 Claims, 10 Drawing Sheets

(56) References Cited

U.S. PATENT DOCUMENTS

| | | | |
|---|---|---|---|
| 2012/0286419 A1* | 11/2012 | Kwon | H01L 25/16 257/737 |
| 2013/0082372 A1* | 4/2013 | Lin | H01L 25/50 438/109 |
| 2013/0299970 A1 | 11/2013 | Harada et al. | |
| 2014/0185264 A1* | 7/2014 | Chen | H01L 23/3128 361/814 |
| 2015/0027754 A1 | 1/2015 | Shimoda et al. | |
| 2015/0228583 A1 | 8/2015 | Karhade et al. | |
| 2015/0279787 A1* | 10/2015 | Kim | H01L 23/544 257/777 |
| 2017/0033086 A1 | 2/2017 | Homma et al. | |
| 2017/0250141 A1 | 8/2017 | Imayoshi | |
| 2018/0331087 A1* | 11/2018 | Lee | H01L 21/561 |
| 2020/0105637 A1* | 4/2020 | Choi | H01L 24/05 |

FOREIGN PATENT DOCUMENTS

| | | |
|---|---|---|
| JP | 3116926 B2 | 12/2000 |
| JP | 2001-288249 A | 10/2001 |
| JP | 3596864 B | 12/2004 |
| JP | 4129666 B2 | 8/2008 |
| JP | 2011-210795 A | 10/2011 |
| JP | 2012-147032 A | 8/2012 |
| JP | 2013-236039 A | 11/2013 |
| JP | 2014-089996 A | 5/2014 |
| JP | 2015-084415 A | 4/2015 |
| JP | 2015-198093 A | 11/2015 |
| JP | 2016-096262 A | 5/2016 |
| JP | 2017-157588 A | 9/2017 |
| JP | 6268310 B2 | 1/2018 |
| JP | 6309119 B2 | 4/2018 |
| JP | 6418605 B2 | 11/2018 |
| JP | 2019-038969 A | 3/2019 |

* cited by examiner

SEMICONDUCTOR DEVICE

CROSS-REFERENCE TO RELATED APPLICATION(S)

This application is based upon and claims the benefit of priority from Japanese Patent Application No. 2020-045222, filed Mar. 16, 2020, the entire contents of which are incorporated herein by reference.

FIELD

Embodiments described herein relate generally to a semiconductor device.

BACKGROUND

A semiconductor device having a plurality of electrode terminals is mounted on a mounting board via the plurality of electrode terminals. At this time, it is desired to improve reliability of the semiconductor device.

Examples of related art include WO2010/024233, JP-A-2012-15398, and US Patent Application Publication No. 2015/0228583.

DETAILED DESCRIPTION

An embodiment provides a semiconductor device capable of improving reliability.

In general, according to at least one embodiment, a semiconductor device includes a substrate; a semiconductor chip; and a plurality of electrode terminals. The substrate has a first principal surface and a second principal surface. The semiconductor chip is disposed on the first principal surface. The plurality of electrode terminals are disposed on the second principal surface. The substrate has a via interconnection near a position at which an outer edge line of the semiconductor chip intersects an outer outline of the electrode terminal farthest from a center of the substrate, the electrode terminal farthest from a center of the substrate being among the plurality of electrode terminals overlapping the outer edge line in a predetermined condition as seen through the substrate from a direction perpendicular to the first principal surface, the via interconnection connecting a first interconnection layer on the first principal surface-side to a second interconnection layer on the second principal surface-side.

A semiconductor device according to at least one embodiment will be described hereinafter in detail with reference to the accompanying drawings. It is noted that this embodiment does not limit the present disclosure.

Embodiment

A semiconductor device according to at least one embodiment is configured as a semiconductor package and mounted on a mounting board. It is desired to improve a packaging density of a system configured with semiconductor packages and the mounting board mounting thereon the semiconductor packages. To realize the improved packaging density, it is conceivable to configure the semiconductor device as a BGA (Ball Grid Array) type or an LGA (Land Grid Array) type semiconductor package. The semiconductor device as the BGA or LGA type semiconductor package has a plurality of electrode terminals. This semiconductor device is mounted on the mounting board via the plurality of electrode terminals.

Figure 1:
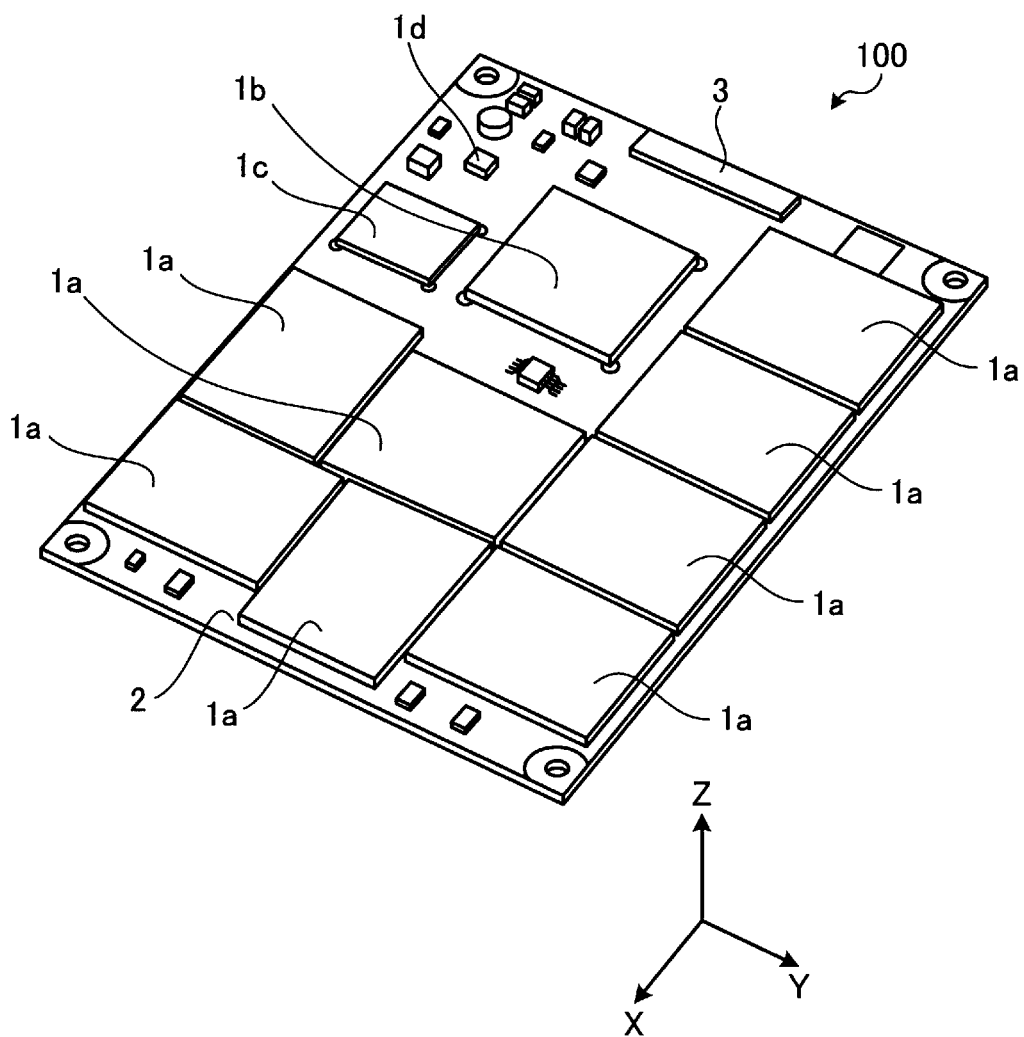
FIG. 1 is a perspective view showing a configuration of a system including semiconductor devices according to at least one embodiment.

For example, a system 100 including semiconductor devices 1 is configured as shown in FIG. 1. FIG. 1 is a perspective view showing a configuration of the system 100 including the semiconductor devices 1. Each semiconductor device 1 is, for example, a memory device including a plurality of semiconductor chips, and the system 100 is a memory system such as an SSD (Solid State Drive).

The system 100 is a module having a plurality of semiconductor devices 1 on a mounting board 2. The mounting board 2 is also referred to as "mother board." The plurality of semiconductor devices 1 are mounted as BGA type semiconductor packages 1a, 1b, 1c, and 1d each having semiconductor chips encapsulated with a resin. For example, the plurality of semiconductor devices 1 are mounted as eight semiconductor packages 1a each incorporating a NAND flash memory as a nonvolatile memory, a semiconductor package 1b incorporating a drive control circuit as a controller, a semiconductor package 1c incorporating a DRAM as a volatile memory, and a semiconductor package 1d incorporating a power supply circuit. Furthermore, a connector 3 that can be connected to a host (not shown) is provided on one of short sides of an outer periphery of the mounting board 2.

Figure 2:
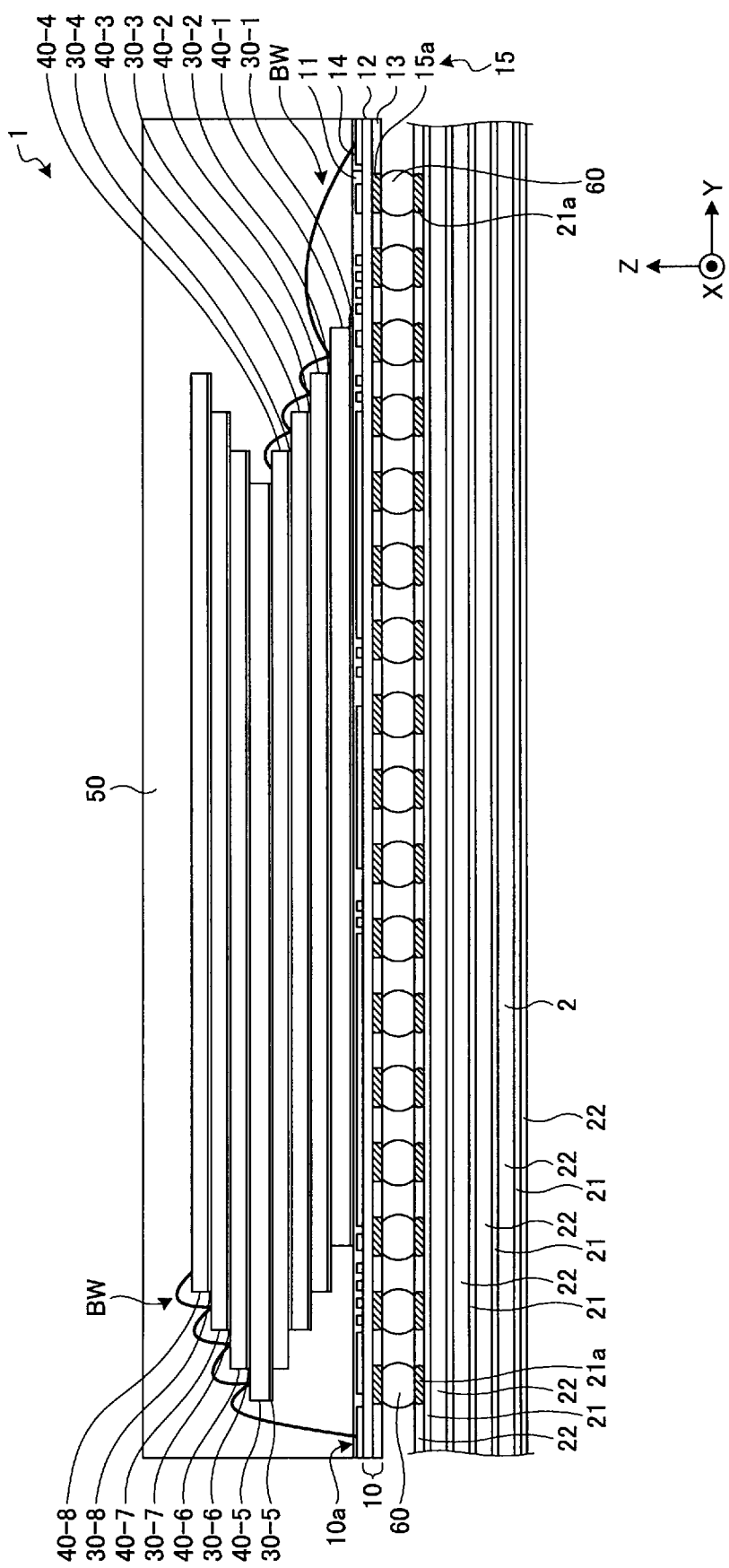
FIG. 2 is a cross-sectional view showing a configuration of the semiconductor device according to at least one embodiment.

The semiconductor device 1 may be configured as shown in FIG. 2. FIG. 2 shows a configuration of the semiconductor device 1.

The semiconductor device 1 has a substrate 10, a plurality of adhesive films 30-1 to 30-8, a plurality of semiconductor chips 40-1 to 40-8, an encapsulation resin 50, and a plurality of electrode terminals 60. It is assumed hereinafter that a direction perpendicular to one of surfaces having a largest area of the substrate 10 (surface 10a, first principal surface) is a Z direction, and that two directions orthogonal to each other in a plane perpendicular to the Z direction are an X direction and a Y direction.

In the semiconductor device 1, the plurality of semiconductor chips 40-1 to 40-8 are stacked in order on the substrate 10. Mounting positions of the plurality of semiconductor chips 40-1 to 40-8 are mutually shifted in the X and Y directions. In a case of FIG. 2, the semiconductor chips 40-1 to 40-5 are mounted in order while being shifted in a −Y direction, and the semiconductor chips 40-5 to 40-8 are mounted in order while being shifted in a +Y direction. Using spaces generated by shifting the mounting positions, an electrode pad on a front surface of each semiconductor chip 40 and an electrode on the substrate 10 are electrically connected via a bonding wire BW. The plurality of semiconductor chips 40-1 to 40-8 are thereby wire bonded and mounted on the substrate 10 face up.

The substrate 10 has the front surface (principal surface) 10a on a +Z side and a rear surface 10b on a −Z side. The plurality of semiconductor chips 40-1 to 40-8 and the plurality of adhesive films 30-1 to 30-8 are mounted on the front surface 10a of the substrate 10, while the plurality of electrode terminals 60 are mounted on the rear surface 10b of the substrate 10. The plurality of semiconductor chips 40-1 to 40-8 and the plurality of adhesive films 30-1 to 30-8 mounted on the front surface 10a-side of the substrate 10 are encapsulated with the encapsulation resin 50. The encapsulation resin 50 is formed from a material containing an insulator as a main component, for example, may be formed from a material containing a first resin exhibiting insulation properties and thermoplastic properties as the main component. The electrode terminals 60 mounted on the rear surface 10b-side of the substrate 10 may be formed from a material containing a conductive substance as a main component, front surfaces of the electrode terminals 60 are exposed, and external elements may be electrically connected to the electrode terminals 60.

The substrate 10 has a solder resist layer 11, a core layer 12, a solder resist layer 13, a conductive layer 14, a conductive layer 15, and a through-hole electrode (not shown).

The solder resist layer 11 is disposed on a +Z side of the core layer 12, and disposed near the front surface 10a of the substrate 10. The solder resist layer 11 may be formed from a material containing an insulator (for example, an insulating organic substance) as a main component.

The core layer 12 is disposed on a −Z side of the solder resist layer 11, disposed on a +Z side of the solder resist layer 13, and disposed within the substrate 10. The core layer 12 may be formed from a material containing an insulator (for example, glass or insulating resin) as a main component.

The solder resist layer 13 is disposed on a −Z side of the core layer 12, and disposed near the rear surface 10b of the substrate 10. The solder resist layer 13 may be formed from a material containing an insulator (for example, insulating resin) as a main component.

The conductive layer 14 is disposed on the +Z side of the core layer 12, and disposed near the front surface 10a of the substrate 10. The conductive layer 14 is an interconnection layer on the front surface 10a-side of the substrate 10, and is also referred to as "L1 interconnection layer." The conductive layer 14 includes a plurality of lines extending in the X and Y directions near the front surface 10a. The conductive layer 14 may be formed from a material containing a conductive substance (for example, copper) as a main component.

The conductive layer 15 is disposed on the −Z side of the core layer 12, and disposed near the rear surface 10b of the substrate 10. The conductive layer 15 is an interconnection layer on the rear surface 10b-side of the substrate 10, and is also referred to as "L2 interconnection layer." The conductive layer 15 includes a plurality of lines extending in the X and Y directions near the rear surface 10b. The conductive layer 15 may be formed from a material containing a conductive substance (for example, copper) as a main component. The conductive layer 15 includes an electrode pattern 15a to which each electrode terminal 60 is electrically connected. A +Z side surface of each electrode terminal 60 may contact the electrode pattern 15a.

The through-hole electrode is disposed on a −Z side of the conductive layer 14, disposed on a +Z side of the conductive layer 15, and disposed between the conductive layers 14 and 15. The through-hole electrode is an electrode that electrically connects the conductive layers 14 and 15 to each other. The through-hole electrode extends in the Z direction between the conductive layers 14 and 15. The through-hole electrode may be formed from a material containing a conductive substance (for example, copper) as a main component, for example.

The adhesive film 30-1 covers the front surface 10a of the substrate 10, and the semiconductor chip 40-1 is stacked on the adhesive film 30-1. The adhesive film 30-1 mediates between the semiconductor chip 40-1 and the front surface 10a of the surface 10 to adhesively bond the semiconductor chip 40-1 onto the front surface 10a thereof via the adhesive film 30-1. The adhesive film 30-1 is also referred to as "DAF (Die Attach Film)" or "DBF (Die Bonding Film)."

The semiconductor chip 40-1 has a front surface on the +Z side and a rear surface on the −Z side. The rear surface of the semiconductor chip 40-1 is adhesively bonded onto the front surface 10a of the substrate 10 via the adhesive film 30-1. The semiconductor chip 40-1 is formed from a material containing a semiconductor (for example, silicon) as a main component. A center position of the semiconductor chip 40-1 in the X and Y directions is slightly shifted from a center position of the substrate 10 in the X and Y directions. FIG. 2 illustrates, by an example, the configuration such that the center position of the semiconductor chip 40-1 in the X and Y directions is slightly shifted from the center position of the substrate 10 in the XY direction to a +Y direction.

It is noted that the adhesive films 30-2 to 30-8 are similar to the adhesive film 30-1. The semiconductor chips 40-2 to 40-8 are similar to the semiconductor chip 40-1.

The semiconductor chips 40-1 to 40-8 may be mounted on the substrate 10 by wire bonding. At this time, the conductive layer 14 of the substrate 10 may have a plurality of electrode patterns on the front surface (+Z side principal surface) 10a, and the electrode pads of the semiconductor chips 40-1 to 40-8 may be electrically connected to the electrode patterns on the front surface 10a of the substrate 10 via bonding wires BW. The plurality of semiconductor chips 40-1 to 40-8 can be thereby mounted on the substrate 10 by the wire bonding.

Figure 3:
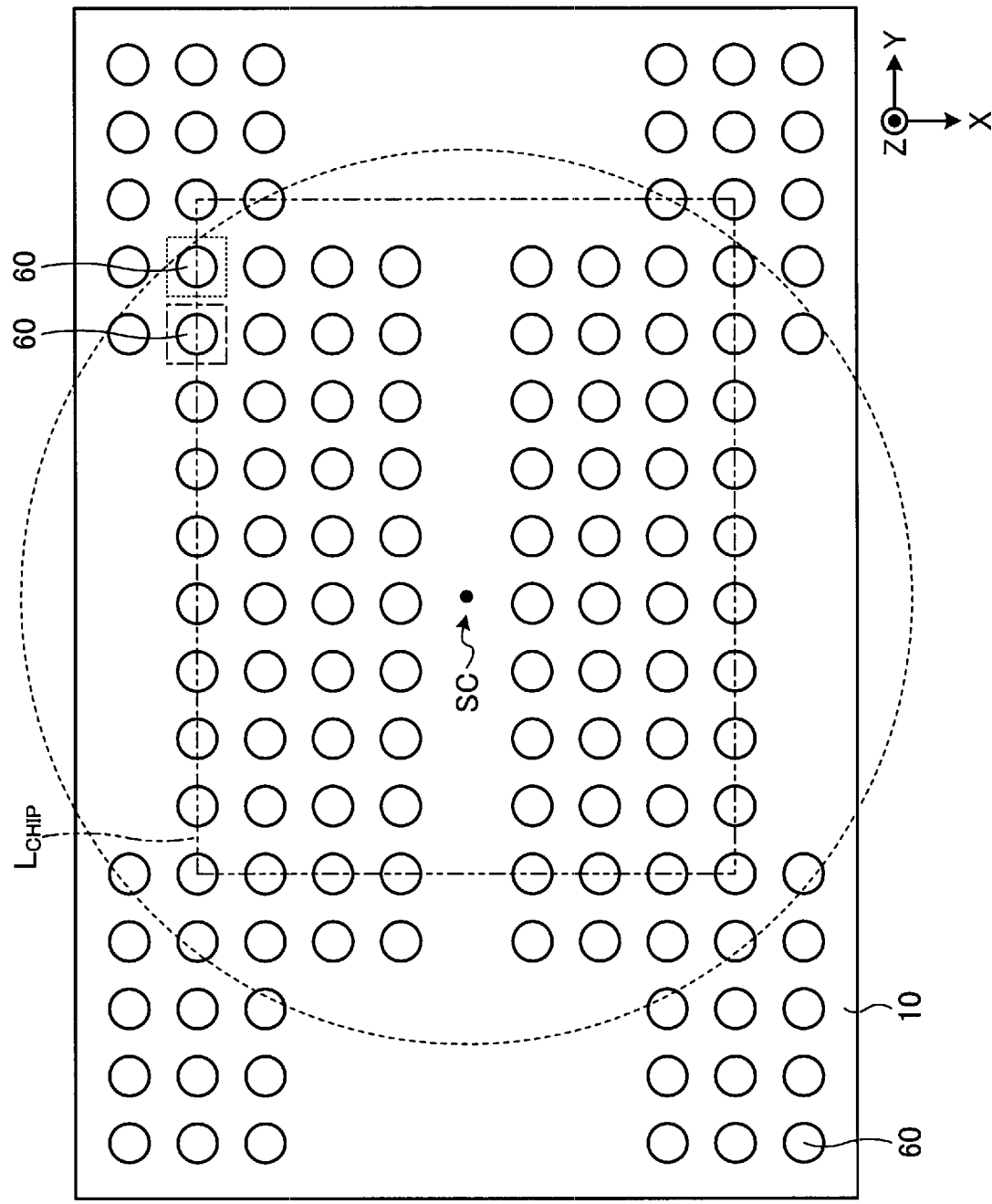
FIG. 3 is a plan view showing the configuration of the semiconductor device according to at least one embodiment.

The plurality of electrode terminals 60 are disposed between the substrate 10 and the mounting board 2. As shown in FIG. 3, the plurality of electrode terminals 60 are arranged in the X and Y directions between the substrate 10 and the mounting board 2. FIG. 3 is a plan view showing the configuration of the semiconductor device 1, and the substrate and the plurality of electrode terminals 60 of the semiconductor device 1 are viewed in FIG. 3 from the −Z side in a state of eliminating the mounting board 2. In FIG. 3, an outer edge line of the lowermost semiconductor chip 40-1 (lowest on the −Z side) among the plurality of semiconductor chips 40-1 to 40-8 is denoted as $L_{CHIP}$ and indicated by a two-dot chain line.

Each electrode terminal 60 is electrically connected to the electrode pattern 15a of the substrate 10 on the +Z side, and electrically connected to an electrode pattern 21a of the mounting board 2 on the −Z side. A +Z-side surface of each electrode terminal 60 may contact the electrode pattern 15a, and a −Z-side surface thereof may contact the electrode pattern 21a. The mounting board 2 may be configured as a multilayer board in which an insulating layer 22 and a conductive layer 21 are alternately stacked a plurality of times. The electrode pattern 21a to which each electrode terminal 60 is electrically connected may be contained in the uppermost conductive layer 21 of the mounting board 2.

At a time of mounting each semiconductor device 1 on the mounting board 2, the electrode terminals (solder balls) 60 are melted by reflow and are each formed as a sphere with upper and lower parts missing as shown in FIG. 2. A shape of each electrode terminal 60 when the semiconductor device 1 is the BGA type semiconductor package does not substantially differ from that when the semiconductor device 1 is the LGA type semiconductor package. The shape of each electrode terminal 60 may be a generally columnar shape having planar surfaces on the +Z and −Z sides. It is noted that a difference in each electrode terminal 60 between the case in which the semiconductor device 1 is the BGA type semiconductor package and the case in which the semiconductor device 1 is the LGA type semiconductor package is a volume of the electrode terminal 60 (for example, an amount of a solder).

Each electrode terminal 60 may be formed from a material containing an electric conductor such as a solder alloy as a main component. Each electrode terminal 60 is often referred to as "solder ball" or "solder bump." Each electrode terminal 60 may be solder joined to the electrode pattern 15a on the +Z side and solder joined to the electrode pattern 21a on the −Z side.

In a design validation test (DVT) of the system 100, a mounting temperature cycle test is conducted in a state of mounting each semiconductor device 1 on the mounting board 2 in the system 100. In the mounting temperature cycle test, at a low temperature, a stress concentrates on a conductive layer 15-side edge of the electrode terminal 60 under the semiconductor chip 40-1 and cracks are often generated in the conductive layer 15 due to a difference in coefficient of linear expansion between the semiconductor chips 40 within the semiconductor device 1 and the mounting board 2. Cracks in the conductive layer 15 caused by repetition of high and low temperatures may possibly cause development of cracks in the core layer 12 and finally cause breaking of the interconnections in the conductive layer 14. As a result, mounting reliability of each semiconductor device 1 possibly deteriorates.

To address the problem, a first technique for relaxing the stress on the plurality of electrode terminals 60 by providing a resin layer covering surroundings of the plurality of electrode terminals 60 on the mounting board 2-side surface of the semiconductor device 1 is considered as a solution. With the first technique, it is possible to relax in whole the stress acting on the plurality of electrode terminals 60 due to the difference in coefficient of linear expansion between the semiconductor chips 40 within the semiconductor device 1 and the mounting board 2. However, a mounting cost of the semiconductor device 1 tends to increase by additionally providing the resin layer. Furthermore, the resin layer is a factor in disturbing a rework operation for a repair of a failure in part of semiconductor device 1 within the system 100.

Figure 4:
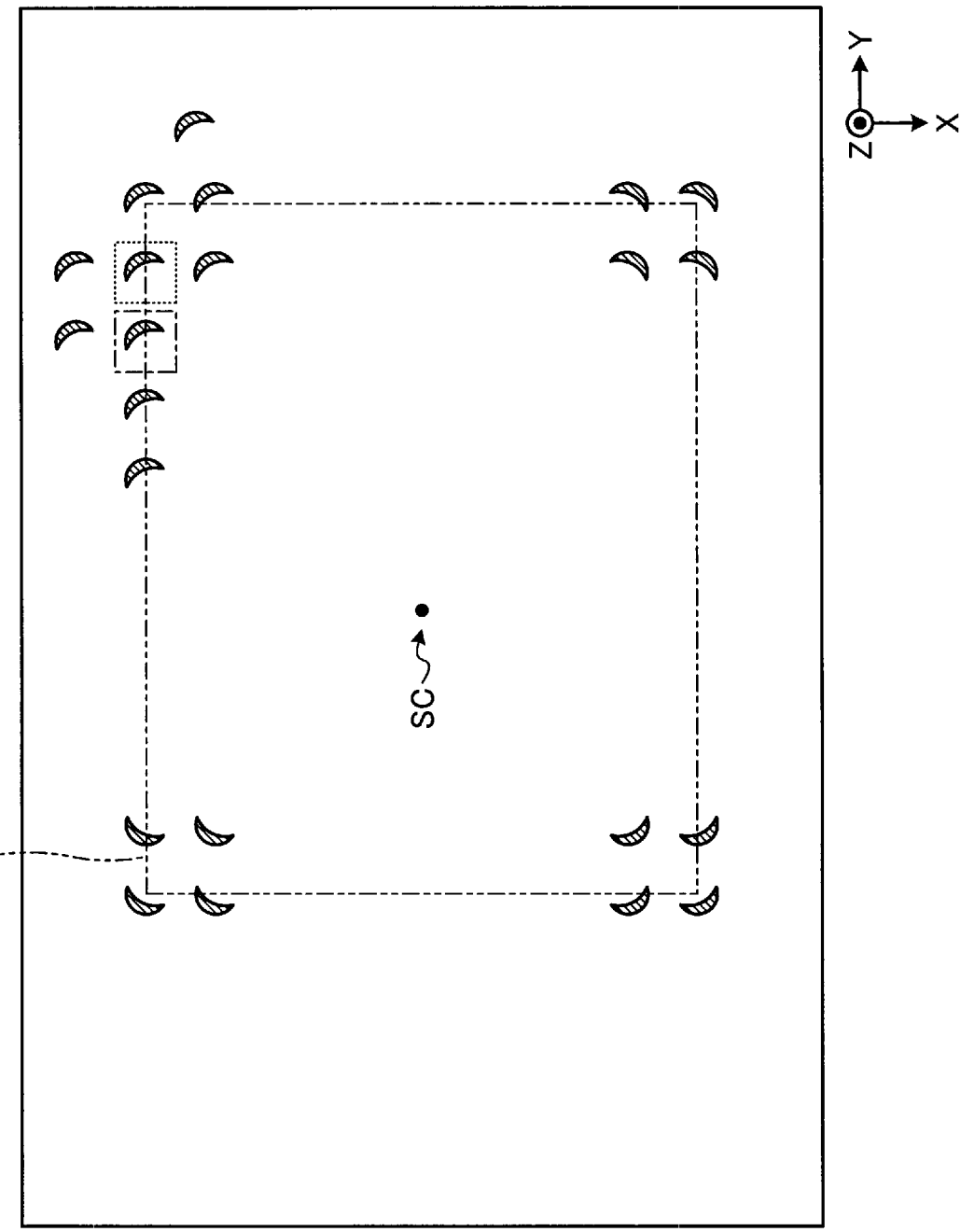
FIG. 4 is a plan view showing a result of a stress simulation according to at least one embodiment.

A simulation conducted with respect to a thermal stress acting between the semiconductor chips 40 within the semiconductor device 1 and the mounting board 2 revealed that the stress acting on the plurality of electrode terminals 60 is not uniform as shown in FIG. 4. FIG. 4 is a plan view showing a result of a stress simulation and corresponds to the plan view of FIG. 3. That is, the stress simulation revealed that in a case of seeing through the substrate 10 of the semiconductor device 1 from the Z direction, the stress acting on the electrode terminals 60 is particularly strong near a position at which the outer edge line $L_{CHIP}$ of the semiconductor chip 40-1 within the semiconductor device 1 intersects an outer outline of the electrode terminal 60 farthest from a center SC of the substrate 10 within the semiconductor device 1 among the plurality of electrode terminals 60. It was revealed, for example, that the stress acting on the electrode terminal 60 indicated by being surrounded by a dotted line square in FIG. 3 is particularly strong near the position at which the outer edge line $L_{CHIP}$ of the semiconductor chip 40-1 intersects the outer outline of the electrode terminal 60. In FIG. 3, positions equidistant to this electrode terminal 60 from the center SC of the substrate 10 are indicated by a dotted line circle.

Figure 5:
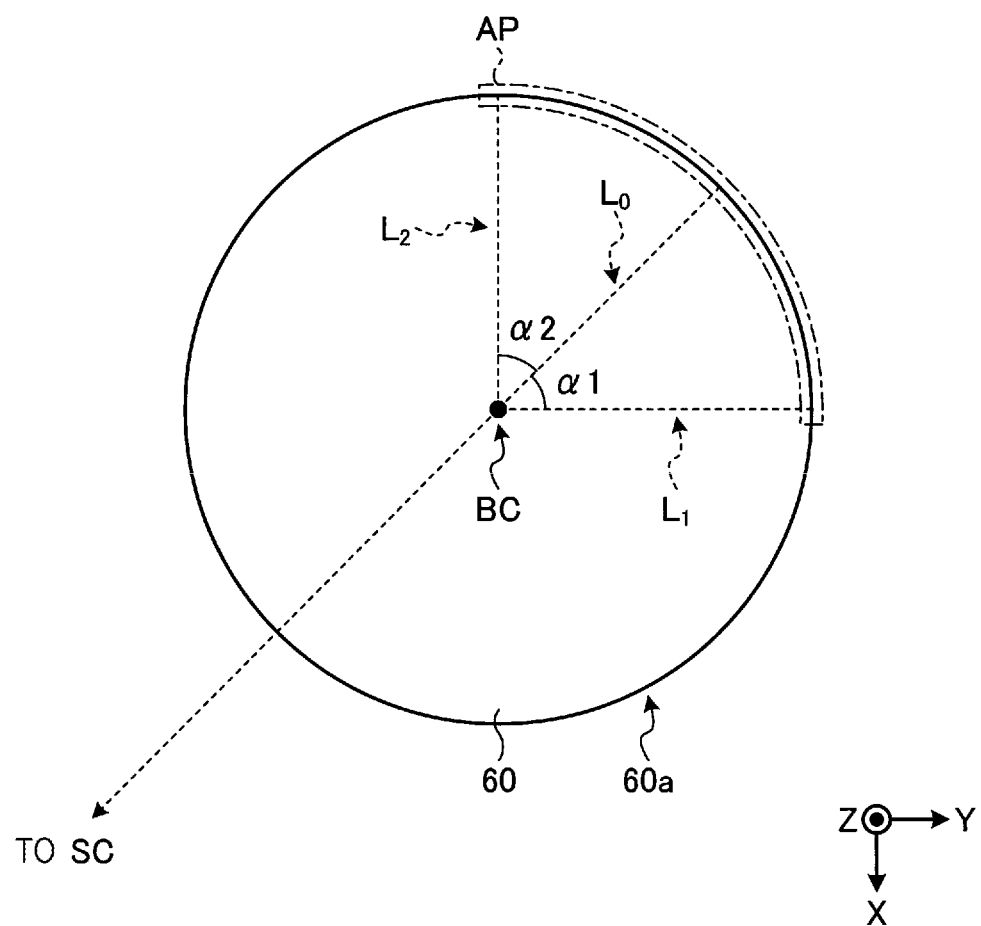
FIG. 5 is a plan view showing a configuration of an electrode terminal according to at least one embodiment.

A more detailed review of the result of the stress simulation revealed that a circular arc part AP farther from the center SC of the substrate 10 is particularly strong out of an outer outline 60a of the electrode terminal 60, as shown in FIG. 5. With a center of the electrode terminal 60 denoted by BC, the circular arc part AP is disposed on the farther side from the center SC of the substrate 10 across the center BC on the outer outline 60a of the electrode terminal 60. It is assumed that a line connecting the center SC of the substrate 10 to the center BC of the electrode terminal 60 is $L_0$, a line connecting the center BC to one end of the circular arc part AP is $L_1$, and a line connecting the center BC to the other end of the circular arc part AP is $L_2$. An angle α1 formed between the lines $L_0$ and $L_1$ and an angle α2 formed between the lines $L_0$ and $L_2$ satisfy the following Expression (1).

$$\alpha 1<90°, \alpha 2<90°, \alpha 1+\alpha 2<180° \tag{1}$$

At least one embodiment, therefore, intends to realize improved mounting reliability at a low cost by adding a via interconnection near the position at which the outer edge line $L_{CHIP}$ of the semiconductor chip 40-1 within the semiconductor device 1 intersects the circular arc part AP of the outer outline 60a of the electrode terminal 60 farthest from the center SC of the substrate 10 within the semiconductor device 1 among the plurality of electrode terminals 60 as seen through the semiconductor device 1 from the Z direction.

Figure 6:
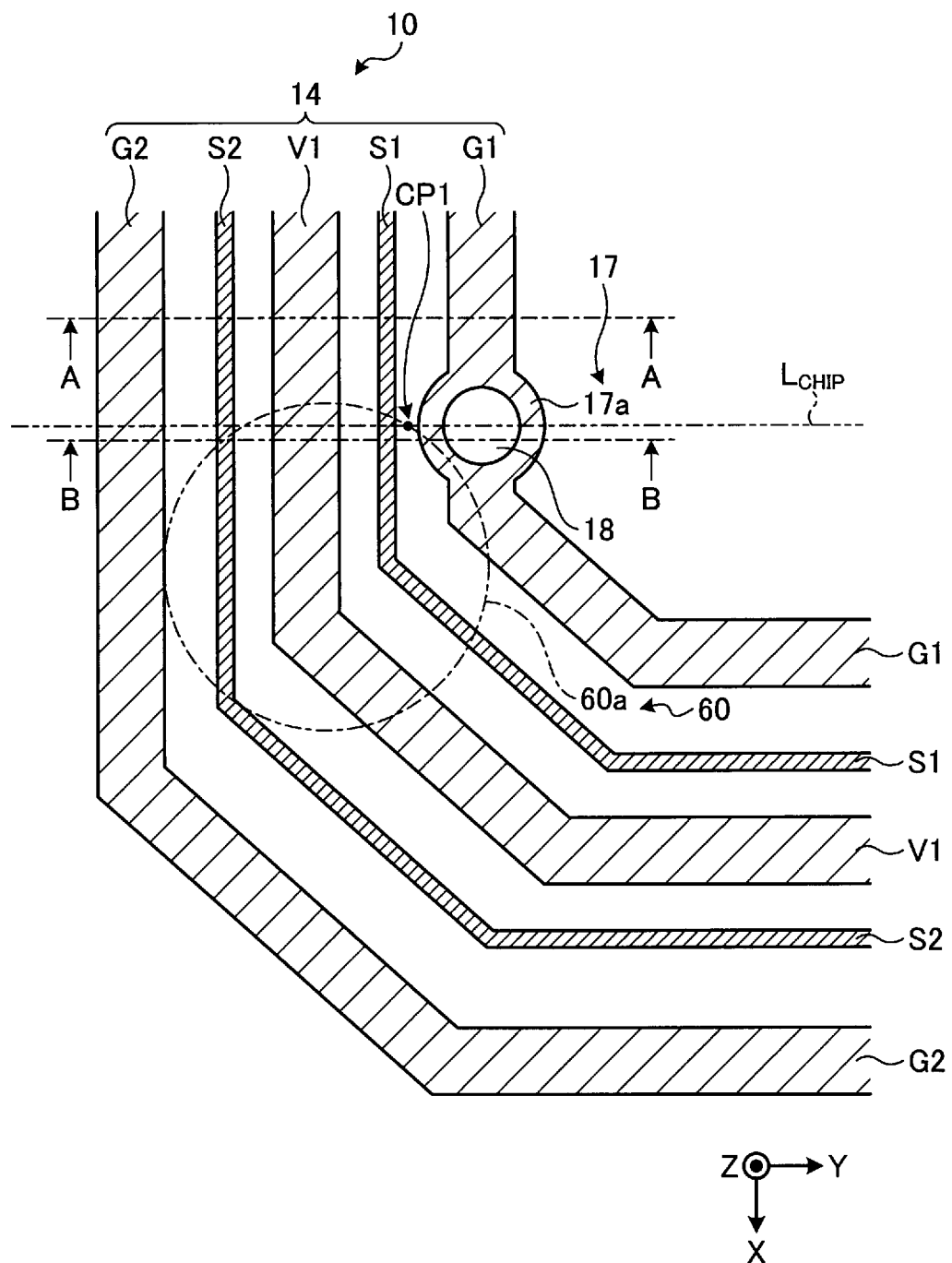
FIG. 6 is a plan view showing configurations of a via interconnection and a reinforcing member according to at least one embodiment.
Figure 7A:
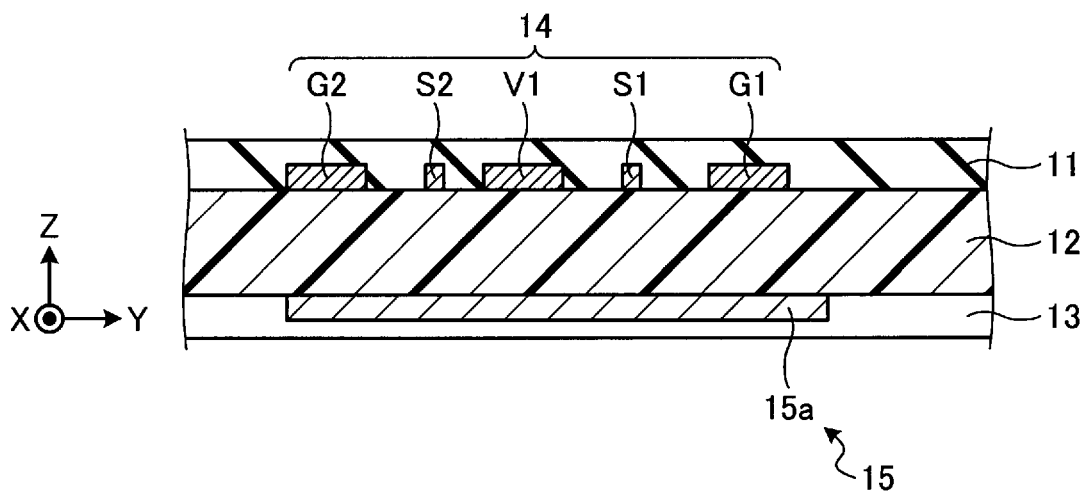
FIGS. 7A and 7B are cross-sectional views showing the configurations of the via interconnection and the reinforcing member according to at least one embodiment.
Figure 7B:
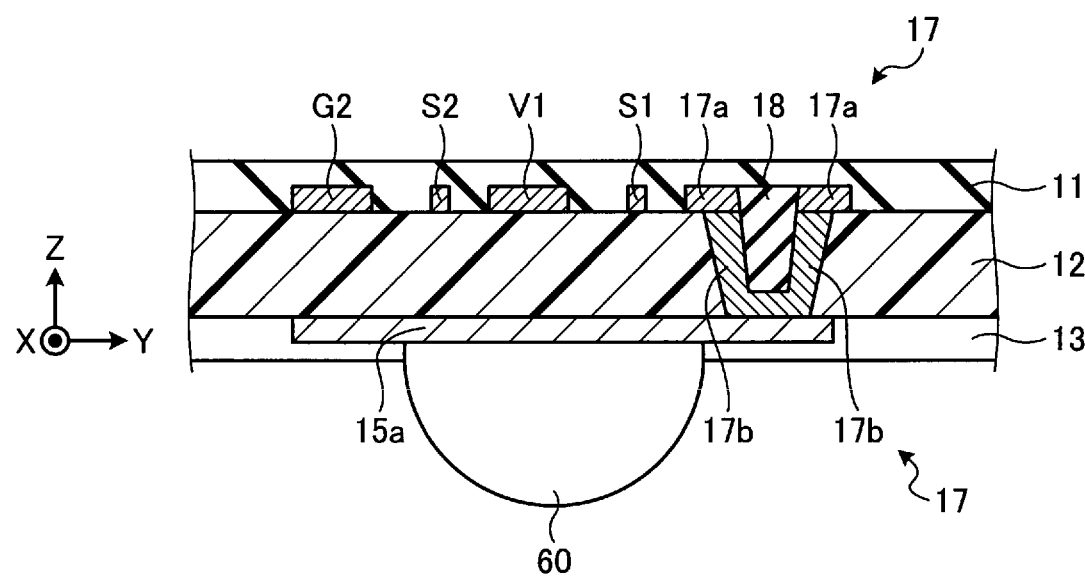

Specifically, the substrate 10 has a via interconnection 17 and a reinforcing member (a reinforcement) 18 as shown in FIGS. 6 to 7B. FIG. 6 is a plan view showing configurations of the via interconnection 17 and the reinforcing member 18, and shows plane configurations in view showing eliminating the solder resist layer 11 from the front surface 10a-side of the substrate 10. FIGS. 7A and 7B are cross-sectional views showing the configurations of the via interconnection 17 and the reinforcing member 18. FIG. 7A shows a cross-section of the plan view of FIG. 6 taken along a line A-A, and FIG. 7B shows a cross-section of the plan view of FIG. 6 taken along a line B-B.

As shown in FIG. 6, the via interconnection 17 and the reinforcing member 18 are disposed near a point of intersection CP1 between the outer edge line $L_{CHIP}$ of the semiconductor chip 40-1 and the circular arc part AP (refer to FIG. 5) of the outer outline 60a of the electrode terminal 60. A ground line G1 (a reference line), a signal line S1, a power-supply line V1, a signal line S2, and a ground line G2 are disposed near the point of intersection CP1 as lines contained in the conductive layer 14. The ground line G1, the signal line S1, the power-supply line V1, the signal line S2, and the ground line G2 extend to be apart from one another in a width direction. The ground line G1, the signal line S1, the power-supply line V1, the signal line S2, and the ground line G2 extend in the +X direction near the point of intersection CP1, extend in the +X and +Y directions, and then extend in the +Y direction.

The signal lines S1 and S2 out of the lines contained in the conductive layer 14 are not suited as locations where the via interconnections 17 are disposed. It is advantageous to ensure qualities of signals to be transmitted on the signal lines S1 and S2, the number of via interconnections to be disposed is determined in advance, and the preset number of via interconnections are already disposed in locations determined in advance other than the locations shown in FIG. 6. Supposing that the via interconnections 17 are provided in the signal lines S1 and S2, the qualities of signals transmitted on the signal lines S1 and S2 possibly degrade.

On the other hand, the ground lines G1 and G2 are suited as locations where the via interconnections 17 are disposed. In FIG. 6, the ground line G1 is closer to the point of intersection CP1 than the ground line G2 and one via interconnection 17 is, therefore, disposed in the ground line G1. In FIG. 6, the center SC of the substrate 10 is present in the +X side and −Y side directions (refer to FIG. 3). As seen through the via interconnection 17 from the Z direction in an XY plan view, the via interconnection 17 is disposed on an outer side of the center SC of the substrate 10 than the signal lines S1 and S2 across the electrode terminal 60. The via interconnection 17 may be formed from a material having electric conductivity and having a higher elastic modulus than that of the core layer 12 (that is, harder than the core layer 12). The via interconnection 17 can thereby prevent cracks caused by the stress acting on the electrode terminal 60 from developing toward the conductive layer 14 and prevent breaking of the signal lines S1 and S2 due to the cracks. That is, the via interconnection 17 can contribute to improving the mounting reliability. Furthermore, as for electrical properties, the via interconnection 17 can make ground potentials of the ground lines G1 and G2 more stable.

As shown in FIGS. 6 to 7B, the via interconnection 17 has an upper portion 17a and a lower portion 17b. The upper portion 17a is a conductive pattern that replaces part of the ground line G1, and may have a ring shape in the XY plan view. The upper portion 17a may be formed from a material containing a metal such as copper as a main component. The upper portion 17a may be formed in the same process as that of the lines contained in the conductive layer 14 at a time of forming the lines. The upper portion 17a is electrically connected to the ground line G1 on +x and −x sides.

The lower portion 17b is disposed between the upper portion 17a and the interconnection layer 15. The lower portion 17b has an approximately cylindrical shape having a closed bottom surface, has an approximately circular shape in the XY plan view, and has an approximately U-shape in a YZ cross-sectional view. The lower portion 17b may be formed from a material containing a metal such as copper as a main component. The lower portion 17b contacts a +Z side surface of the interconnection layer 15 on the −Z side, mainly extends in the +Z direction, and contacts a −Z side surface of the upper portion 17a on the +Z side. The lower portion 17b electrically connects the upper portion 17a to the interconnection layer 15. While FIG. 7B illustrates, by an example, a configuration such that a plane width of a −Z side part of the lower portion 17b is slightly smaller than that of a +Z side part thereof, both plane widths may be approximately identical.

In the via interconnection 17, a hole formed within the upper portion 17a and a hole formed within the lower portion 17b configure a hole portion.

The reinforcing member 18 is disposed in the hole portion formed within the via interconnection 17 and buries the hole portion within the via interconnection 17. The reinforcing member 18 has a substantially columnar shape, has a substantially circular shape in the XY plan view, and has a substantially I-shape in the YZ cross-sectional view. While FIG. 7B illustrates by an example a configuration such that a plane width of a −Z side part of the reinforcing member 18 is slightly smaller than that of a +Z side part thereof, both plane widths may be substantially identical. The reinforcing member 18 may be formed from a material such as a resin or a metal having a higher elastic modulus than that of the core layer 12 (that is, harder than the core layer 12). In a case of adopting a material containing a metal as a main component for the reinforcing member 18, the reinforcing member 18 may be formed by burying an interior of the via interconnection 17 with a plating metal. The reinforcing member 18 can thereby prevent cracks caused by the stress acting on the electrode terminal 60 from developing toward the conductive layer 14 and prevent breaking of the signal lines S1 and S2 due to the cracks. That is, the reinforcing member 18 can contribute to improving the mounting reliability.

As described so far, in at least one embodiment, as seen through the substrate 10 of the semiconductor device 1 from the Z direction, the via interconnection 17 is additionally disposed near the position (point of intersection CP1) at which the outer edge line $L_{CHIP}$ of the semiconductor chip 40-1 within the semiconductor device 1 intersects the circular arc part AP of the outer outline 60a of the electrode terminal 60 farthest from the center SC of the substrate 10 within the semiconductor device 1 among the plurality of electrode terminals 60. It is thereby possible to prevent cracks caused by the stress acting on the electrode terminal 60 from developing toward the conductive layer 14 and prevent breaking of the signal lines S1 and S2 due to the cracks. As a result, it is possible to improve the mounting reliability of the semiconductor device 1 at a low cost, extend a range of heat-resistant temperatures of the semiconductor device 1 and a low-temperature side heat-resistant area that is a use environment of a data center, for example, the Arctic environment, and prolong endurance time of the system 100. That is, it is possible to extend the life of the semiconductor device 1 in terms of the range of the heat-resistant temperatures and the length of the endurance time.

Furthermore, in at least one embodiment, the reinforcing member 18 higher in elastic modulus than the core layer 12 is additionally disposed in the hole portion formed inside of the via interconnection 17 on the substrate 10 of the semiconductor device 1. It is thereby possible to further prevent cracks caused by the stress acting on the electrode terminal 60 from developing toward the conductive layer 14 and prevent breaking of the signal lines S1 and S2 due to the cracks.

It is noted that, when the mounting reliability is to be further improved, a via interconnection 17 may be further additionally disposed near the position (point of intersection CP1) at which the outer edge line $L_{CHIP}$ of the semiconductor chip 40-1 within the semiconductor device 1 intersects the circular arc part AP of the outer outline 60a of the electrode terminal 60 second farthest from the center SC of the substrate 10 within the semiconductor device 1 among the plurality of electrode terminals 60 as seen (visible) through the substrate 10 of the semiconductor device 1 from the Z direction. Such a second farthest electrode terminal 60 is, for example, the electrode terminal 60 shown to be surrounded by a chain-line square in FIG. 3.

Figure 8:
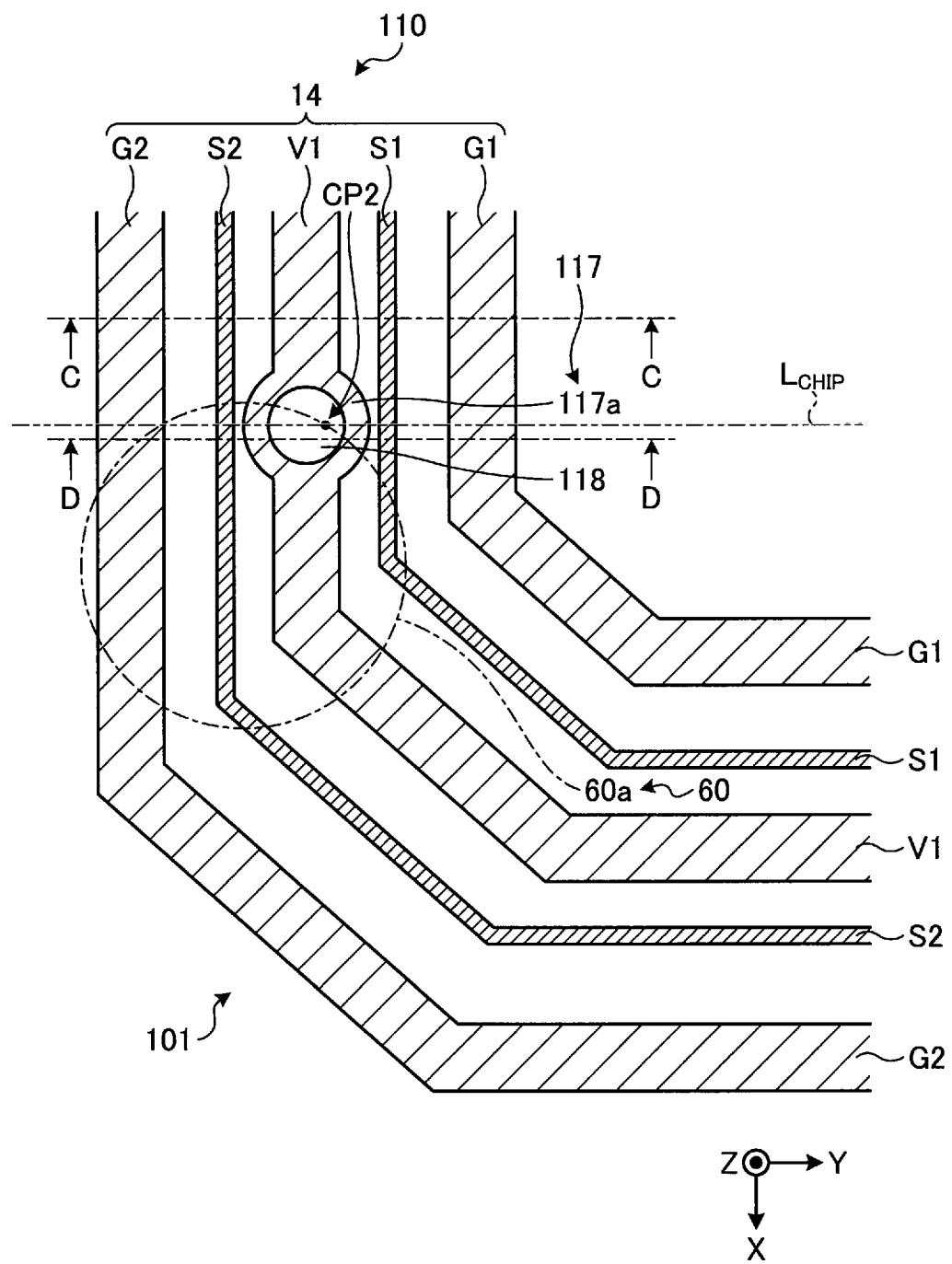
FIG. 8 is a plan view showing configurations of a via interconnection and a reinforcing member according to a first modification of at least one embodiment.
Figure 9A:
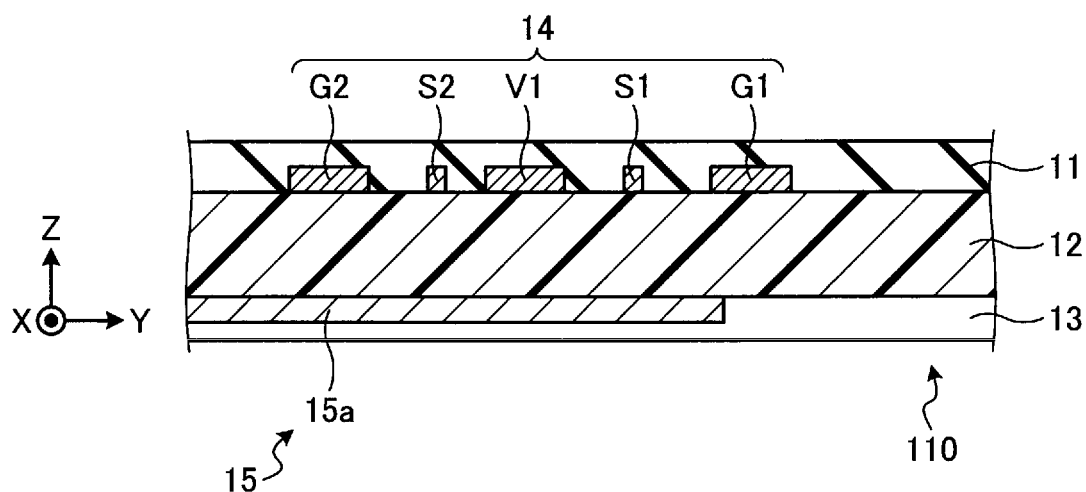
FIGS. 9A and 9B are cross-sectional views showing the configurations of the via interconnection and the reinforcing member according to the first modification of at least one embodiment.
Figure 9B:
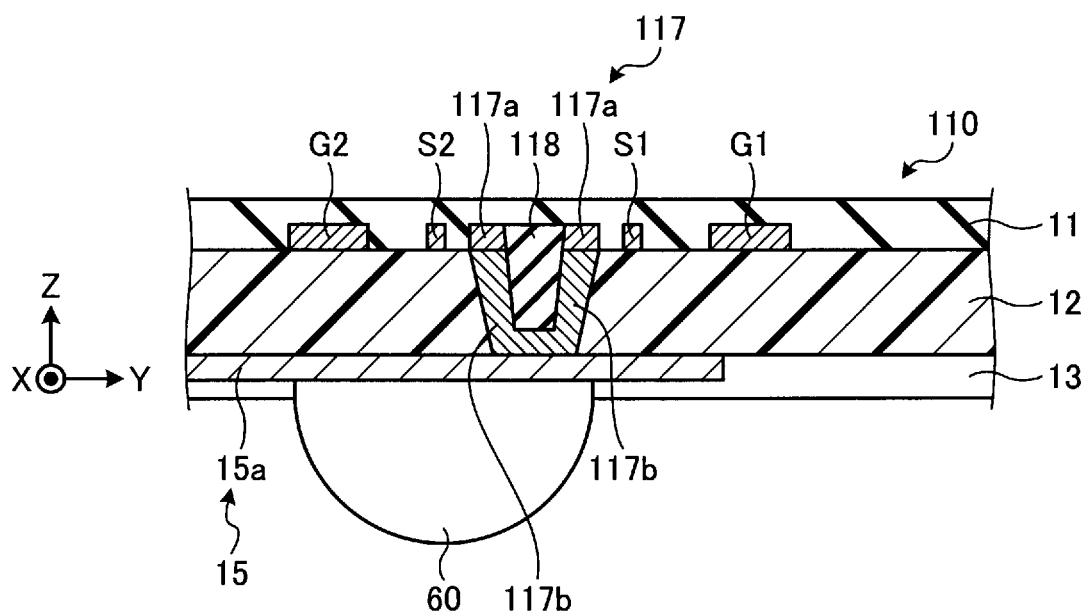

Alternatively, the via interconnection 117 may be disposed in the power-supply line V1 when a point of intersection CP2 between the outer edge line $L_{CHIP}$ of the semiconductor chip 40-1 and the circular arc part AP (refer to FIG. 5) of the outer outline 60a of the electrode terminal 60 is closer to the power-supply line V1 than to the ground lines G1 and G2. In this case, as shown in FIGS. 8 to 9B, a substrate 110 of a semiconductor device 101 has a via interconnection 117 and a reinforcing member 118 as an alternative to the via interconnection 17 and the reinforcing member 18 (refer to FIG. 6). FIG. 8 is a plan view showing configurations of the via interconnection 117 and the reinforcing member 118 according to a first modification of the embodiment, and shows plane configurations in a case of eliminating the solder resist layer 11 from the front surface 10a-side of the substrate 110. FIGS. 9A and 9B are cross-sectional views showing the configurations of the via interconnection 117 and the reinforcing member 118 according to the first modification of the embodiment. FIG. 9A shows a cross-section of the plan view of FIG. 8 taken along a line C-C, and FIG. 9B shows a cross-section of the plan view of FIG. 8 taken along a line D-D.

The power-supply line V1 (a reference line) is suited as a location where the via interconnection 117 is disposed. In FIG. 8, the center SC of the substrate 110 is present in the +X side and -Y side directions (refer to FIG. 3). In a case of seeing through the via interconnection 117 from the Z direction in the XY plan view, the via interconnection 117 is disposed on an inner side of the center SC of the substrate 10 than the signal line S1 across the electrode terminal 60. The via interconnection 117 may be formed from a material having electric conductivity and having a higher elastic modulus than that of the core layer 12 (that is, harder than the core layer 12). The via interconnection 117 can thereby prevent cracks caused by the stress acting on the electrode terminal 60 from developing toward the conductive layer 14 and prevent breaking of the signal lines S1 and S2 due to the cracks. That is, the via interconnection 117 can contribute to improving the mounting reliability. Furthermore, as for electrical properties, the via interconnection 117 can make the ground potential of the power-supply line V1 more stable.

As shown in FIGS. 8 to 9B, the via interconnection 117 has an upper portion 117a and a lower portion 117b. Specific configurations of the upper portion 117a and the lower portion 117b are similar to those of the upper portion 17a and the lower portion 17b in at least one embodiment.

The reinforcing member 118 is disposed in a hole portion formed within the via interconnection 117 and buries the hole portion within the via interconnection 117. A specific configuration of the reinforcing member 118 is similar to that of the reinforcing member 18 in the embodiment. The reinforcing member 118 may be formed from a material such as a resin or a metal having a higher elastic modulus than that of the core layer 12 (that is, harder than the core layer 12). In a case of adopting a material containing a metal as a main component for the reinforcing member 118, the reinforcing member 118 may be formed by burying an interior of the via interconnection 17 with a plating metal.

The reinforcing member 118 can thereby prevent cracks caused by the stress acting on the electrode terminal 60 from developing toward the conductive layer 14 and prevent breaking of the signal lines S1 and S2 due to the cracks. That is, the reinforcing member 118 can contribute to improving the mounting reliability.

In this way, disposing the via interconnection 117 and the reinforcing member 118 in the power-supply line V1 in the substrate 10 of the semiconductor device 101 similarly makes it possible to improve the mounting reliability of the semiconductor device 101.

Figure 10:
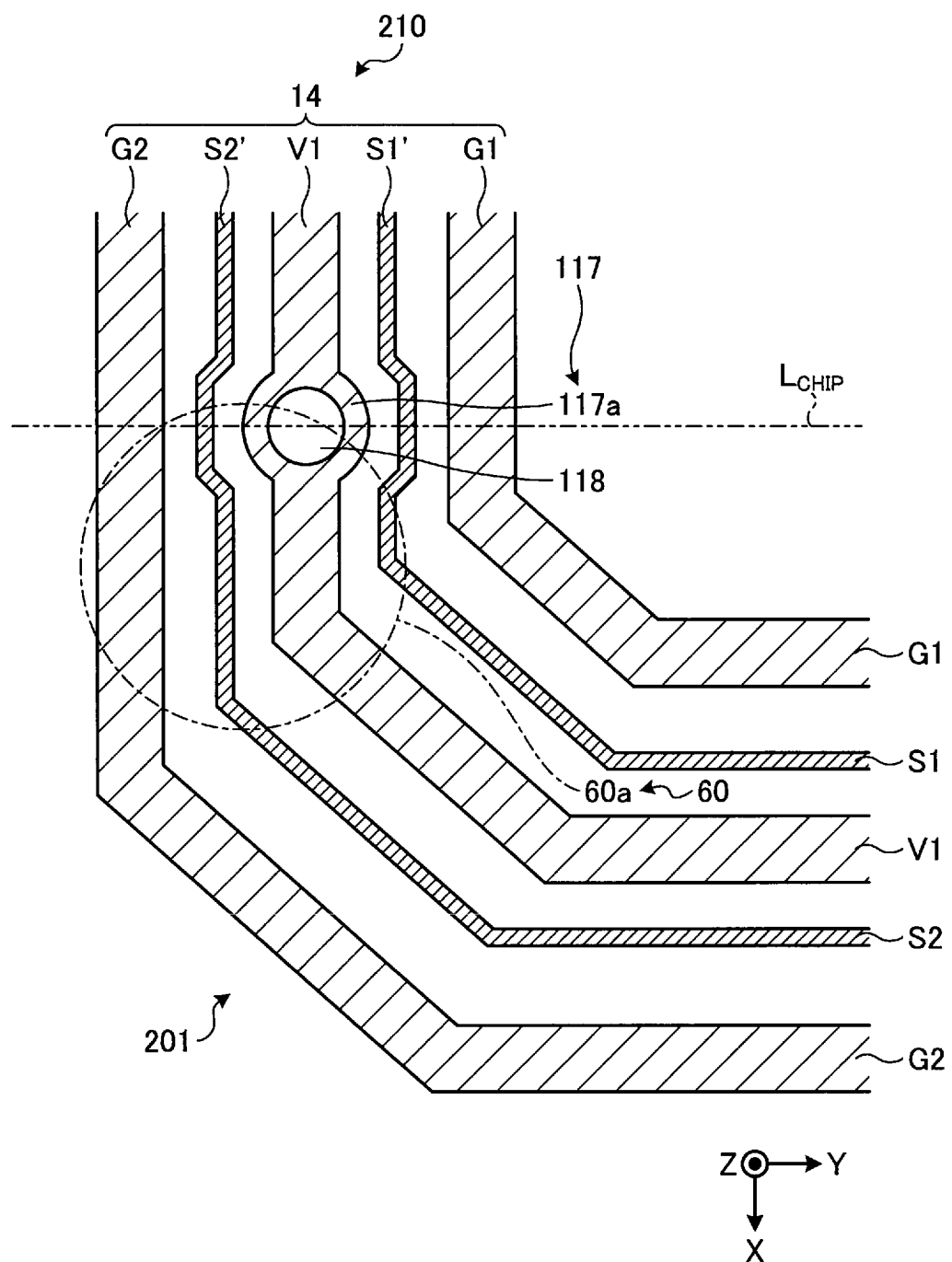
FIG. 10 is a plan view showing configurations of a via interconnection and a reinforcing member according to a second modification of at least one embodiment.

In another alternative, layout patterns of signal lines S1' and S2' may be partially changed to detour the via interconnection 117 to accompany disposing the via interconnection 117. In this case, as shown in FIG. 10, a substrate 210 of a semiconductor device 201 has a conductive layer 14' as an alternative to the conductive layer 14 (refer to FIG. 6). The conductive layer 14' has signal lines S1' and S2' as an alternative to the signal lines S1 and S2 (refer to FIG. 6).

The signal line S1' extends in the +X direction until being close to the upper portion 117a of the via interconnection 117, extends in the +X and +Y directions near a -X side end portion of the upper portion 117a, extends again in the +X direction, extends in the +X and -Y directions near a +X side end portion of the upper portion 117a, and extends again in the +X direction. It is thereby possible to locate the signal line S1' at about a midpoint between the power-supply line V1 and the ground line G1, and prevent a crosstalk between the signal line S1' and the power-supply line V1 or between the signal line S1' and the ground line G1.

Likewise, the signal line S2' extends in the +X direction until being close to the upper portion 117a of the via interconnection 117, extends in the +X and -Y directions near the -X side end portion of the upper portion 117a, extends again in the +X direction, extends in the +X and +Y directions near the +X side end portion of the upper portion 117a, and extends again in the +X direction. It is thereby possible to locate the signal line S2' at about a midpoint between the ground line G2 and the power-supply line V1, and prevent a crosstalk between the signal line S2' and the ground line G2 or between the signal line S2' and the power-supply line V1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a substrate having a first principal surface and a second principal surface;
   a first semiconductor chip disposed closest to and on the first principal surface; and
   a first plurality of electrode terminals disposed on the second principal surface, wherein
   (a) a first electrode terminal farthest from a center of the substrate from among a second plurality of electrode terminals overlapping an outline of the first semiconductor chip as seen through the substrate from a direction perpendicular to the first principal surface, the first plurality of electrode terminals including the second plurality of electrode terminals, a via interconnection connecting a first interconnection layer on a first principal surface-side to a second interconnection layer on a second principal surface-side, (b) as seen through the substrate from a direction perpendicular to the first principal surface, the outline of the first semiconductor chip, an outline of the first electrode terminal and the via interconnection are overlapping at a single point, wherein an outline of the via interconnection is smaller than the outline of the first electrode terminal.

2. The semiconductor device according to claim 1, wherein the electrode terminals each have an approximately circular shape in a plan view, and the overlapping outline of the first semiconductor chip includes an overlap of a circular arc part farther from the center of the substrate.

3. The semiconductor device according to claim 2, wherein the circular arc part is a portion having an angle smaller than 180° with respect to a center of the first electrode terminal on the overlapping outline of the first semiconductor chip.

4. The semiconductor device according to claim 1, wherein the first interconnection layer includes a signal line across the first electrode terminal as seen through the first interconnection layer from the direction perpendicular to the first principal surface, and the via interconnection is disposed on an outer side of the center of the substrate than the signal line as seen through the via interconnection from the direction perpendicular to the first principal surface.

5. The semiconductor device according to claim 4, wherein the first interconnection layer includes a signal line, across the first electrode terminal, and a reference line, disposed outside of the signal line and extending along the signal line, as seen through the first interconnection layer from the direction perpendicular to the first principal surface, and the via interconnection connects the reference line to the second interconnection layer.

6. The semiconductor device according to claim 1, wherein the first interconnection layer includes a signal line across the first electrode terminal as seen through the first interconnection layer from the direction perpendicular to the first principal surface, and the via interconnection is disposed on an inner side of the center of the substrate than the signal line as seen through the via interconnection from the direction perpendicular to the first principal surface.

7. The semiconductor device according to claim 6, wherein the first interconnection layer includes a signal line, across the first electrode terminal, and a reference line, disposed inside of the signal line and extending along the signal line as seen through the first interconnection layer from the direction perpendicular to the first principal surface, and the via interconnection connects the reference line to the second interconnection layer.

8. The semiconductor device according to claim 1, wherein the substrate further includes a core layer disposed between the first interconnection layer and the second interconnection layer and penetrated by the via interconnection, and the via interconnection being higher in elastic modulus than the core layer.

9. The semiconductor device according to claim 8, wherein the via interconnection has an approximately cylindrical shape having a closed bottom surface, and the substrate further includes a reinforcing member disposed in a hole portion formed inside of the via interconnection and higher in elastic modulus than the core layer.

10. The semiconductor device according to claim 1, wherein the electrode terminals comprise solder bumps.

11. The semiconductor device according to claim 1, wherein the electrode terminals have a generally columnar shape.

12. The semiconductor device according to claim 1, wherein a lower portion of the via connection comprises metal.

13. The semiconductor device according to claim 1, wherein the substrate further includes a core layer disposed between the first interconnection layer and the second interconnection layer and penetrated by the via interconnection, and a reinforcing member disposed in a hole portion formed inside of the via interconnection.

14. The semiconductor device according to claim 13, wherein the reinforcing member buries the hole portion.

15. The semiconductor device according to claim 13, wherein the reinforcing member has a substantially columnar shape.

16. The semiconductor device according to claim 13, wherein the reinforcing member comprises at least one of metal or resin.

* * * * *